(12) United States Patent
Park et al.

(10) Patent No.: US 7,387,933 B2
(45) Date of Patent: Jun. 17, 2008

(54) EEPROM DEVICE AND METHOD OF FABRICATING THE SAME

(75) Inventors: Weon-Ho Park, Suwon-si (KR); Hyun-Khe Yoo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 42 days.

(21) Appl. No.: 11/418,425

(22) Filed: May 4, 2006

(65) Prior Publication Data

US 2006/0199334 A1 Sep. 7, 2006

Related U.S. Application Data

(62) Division of application No. 10/872,858, filed on Jun. 21, 2004, now Pat. No. 7,166,887.

(30) Foreign Application Priority Data

Jul. 1, 2003 (KR) ................................. 2003-44346

(51) Int. Cl.
*H01L 21/336* (2006.01)
(52) U.S. Cl. ................. 438/257; 257/315; 257/E21.68; 257/E21.422; 257/E29.129; 257/E29.3
(58) Field of Classification Search ................ 438/257; 257/315, E21.68, E21.422, E29.3
See application file for complete search history.

(56) References Cited

U.S. PATENT DOCUMENTS 6,555,869 B2 * 4/2003 Park .......................... 257/315

* cited by examiner

*Primary Examiner*—Andy Huynh
(74) *Attorney, Agent, or Firm*—F. Chau & Assoc., LLC

(57) ABSTRACT

A memory device comprises a semiconductor substrate of a first conductive type, a memory transistor, a select transistor, a floating junction region, a common source region, and a bit line junction region. The floating junction region is formed of a second conductive type on the semiconductor substrate below a tunnel insulating film. The common source region of a second conductive type is formed on the semiconductor substrate adjacent a memory transistor gate and separated from the floating junction region. A bit line junction region of a second conductive type is formed on the semiconductor substrate adjacent a select transistor gate and is separated from the floating junction region, wherein the common source region includes a single junction region with a first doping concentration, and a depth of the common source region is shallower than a depth of the floating junction region and the bit line junction region.

8 Claims, 11 Drawing Sheets

EEPROM DEVICE AND METHOD OF FABRICATING THE SAME

CROSS-REFERENCE TO RELATED APPLICATION

This application is a Divisional of U.S. patent application Ser. No. 10/872,858 filed on Jun. 21, 2004, now U.S. Pat. No. 7,166,887 which is incorporated herein by reference.

TECHNICAL FIELD

The present disclosure relates to an electrically erasable programmable read only memory (EEPROM) device and a method of fabricating the same, and more particularly, to a floating gate tunnel oxide (FLOTOX) EEPROM with a consistent distribution of cell threshold voltages and a method of fabricating the same.

BACKGROUND

An electrically erasable programmable read only memory (EEPROM) device is a non-volatile memory device in which data can be electrically programmed and erased therein. A floating gate tunnel oxide (FLOTOX) EEPROM stores data at logic levels of a "1" or "0" by injecting electrons into or discharging electrons from a floating gate insulated from a peripheral area, using the Fowler-Nordheim effect.

In a memory cell of an EEPROM, the size of a unit cell is reduced as the capacity of cell memory increases. However, when the size of a unit cell is reduced, cell characteristics can be degraded. For example, an inconsistency in cell threshold voltages Vth of the erased cells and the programmed cells may occur. A reason of the inconsistency of the cell threshold voltages Vth is a shortened effective channel length of a memory transistor. By increasing the effective channel length without increasing the size of the cells, the cell threshold voltage distribution can be improved.

FIG. 1A is a layout of a conventional FLOTOX EEPROM cell. FIGS. 1B and 1C are cross-sectional views taken along lines Y-Y' and X-X' in FIG. 1, respectively.

Referring to FIGS. 1A to 1C, a memory cell of an EEPROM is formed along an active region 103, in which two transistors are formed in series. The active region 103 is separated by an inactive region formed of a field insulating film 105. One of the two transistors is a memory transistor including a floating gate 141 and is electrically connected to a sense line 143. The other transistor is a select transistor electrically connected to a word line 145. A drain region of the select transistor electrically connected to a bit line (not shown) constitutes a bit line junction region 139. A source region of the select transistor and a drain region of the memory transistor constitute a floating junction region 130. A source region of the memory transistor constitutes a common source region 138.

Referring to FIG. 1C, a gate insulating layer 116a including a thin tunnel insulating film 114 is formed on a portion of the floating junction region 130. A memory transistor gate includes a floating gate 141, an inter-gate insulating film 142, and a control gate 143, stacked on the gate insulating film 116a. The control gate 143 forms a sense line extending along a line. A select transistor gate 145 formed on a gate insulating film 116b is separated at a distance from the memory transistor. The select transistor gate 145 forms a word line that extends along a line. Side wall spacers 115 are formed on side walls of the memory transistor gate (including 141, 142, and 143) and the select transistor gate 145.

The floating junction region 130 extends to a side of the select transistor gate 145 and is formed below the tunnel insulating film 114. The floating junction region 130 includes a deep N+ type dopant region 131 below the tunnel insulating film 114 and a high voltage N– (HVN–) type dopant region 132 formed adjacent to the deep N+ type dopant region. The HVN– indicates an N– type dopant suitable for an application of a high voltage of about 15V~about 20V. The HVN– has a greater junction depth than an N+ type dopant region 135.

The common source region 138 has a double diffusion (DD) structure. In other words, the N+ type dopant region 135 is formed on the HVN– dopant region 134. The bit line junction region 139 also has a double diffusion structure with the N+ type dopant region 136 formed on the HVN– region 133. The HVN– type dopant regions 132, 133, and 134 have greater junction depths than the N+ type dopant regions 135 and 136.

In a conventional EEPROM, the HVN– dopant regions 132, 133, and 134 are formed to equal depths on the substrate 100 after the deep N+ type dopant region 131 of the floating junction region 130 is formed. Then, the common source region 138 including a double diffusion structure is formed by the N+ type dopant region 135 in the common source region 138. Tthe bit line junction region 139 including the double diffusion structure is formed by the N+ type dopant region 136 in the bit line junction region 139. The N+ type dopant regions 135 and 136 have shallower depths than the HVN– type dopant regions 132, 133, and 134.

In the conventional EEPROM cell, the HVN– dopant region 134 in the common source region 138 is formed at the same time and to the same depth as the HVN– dopant regions 132 and 133. As a result, lateral diffusion toward the floating junction region 130 becomes large. Accordingly, an effective channel length of the memory transistor reduces to the extent of the lateral diffusion. A reduced effective channel length may result in an uneven distribution of a threshold voltage.

FIG. 1D is a cross-sectional view of another conventional EEPROM. Referring to FIG. 1D, the common source region 138 has a lightly doped drain (LDD) structure. Japanese Patent Laid-Open Publication No. 2002-305260 discloses an EEPROM cell including a common source region with the LDD structure.

In EEPROM structure of FIG. 1D, the common source region 138 includes the LDD structure by forming a low voltage N– LVN– dopant region with a shallow depth between the N+ type dopant region 135 and the channel. As a result, the LVN– type dopant region 137 is formed with a shallower depth than the HVN– type dopant regions 132 and 133. As the extent of lateral diffusion decreases, the effective channel length of the transistor increases. Decreased lateral diffusion reduces inconsistencies in the threshold voltage.

SUMMARY OF THE INVENTION

The EEPROM device including a common source region with the N type LDD structure (NLDD structure) can still have an inconsistent threshold voltage as the cell size decreases. An EEPROM with an increased effective channel length may reduce the inconsistent threshold voltage. Exemplary embodiments of the invention generally include EEPROM devices with cells that provide a consistent threshold voltage distribution by maintaining an effective channel length, even when the cell size is reduced, thereby improving overall cell characteristics, as well as methods for fabricating such EEPROM devices.

In one exemplary embodiment of the invention, an EEPROM device comprises: a semiconductor substrate of a first conductive type; a memory transistor positioned on the semiconductor substrate, the memory transistor comprising a gate insulating film formed on the semiconductor substrate and a memory transistor gate formed on the gate insulating film, the gate insulating film including a tunnel insulating film; a select transistor positioned on the semiconductor substrate and separated from the memory transistor gate, the select transistor comprising a gate insulating film formed on the semiconductor substrate and a select transistor gate formed on the gate insulating film; a floating junction region formed of a second conductive type on the semiconductor substrate below the tunnel insulating film; a common source region of a second conductive type formed on the semiconductor substrate adjacent to the memory transistor gate and separated from the floating junction region; and a bit line junction region of a second conductive type formed on the semiconductor substrate adjacent to the select transistor gate and separated from the floating junction region, wherein the common source region includes a single junction region with a first doping concentration, and a depth of the common source region is shallower than a depth of the floating junction region and the bit line junction region.

According to another exemplary embodiment of the present invention, the select transistor gate includes a floating gate, an inter-gate insulating film, and a word line.

According to yet another exemplary embodiment of the present invention, each of the memory transistor gate and the select transistor gate has a self-aligned stack structure.

In another embodiment of the invention, a method of fabricating an EEPROM device comprises: forming a first insulating film on a semiconductor substrate on which an active region and an inactive region are defined; forming a dopant region with a first doping concentration on the semiconductor substrate on which a floating junction region is to be formed; forming a thin tunnel insulating film on the dopant region with the first doping concentration; forming a select transistor gate and a memory transistor gate on the first insulating film, the select transistor gate separated from the memory transistor gate; forming a floating junction region by forming a first high voltage dopant region with a second doping concentration, the second doping concentration being lower concentration than the first doping concentration and being adjacent to a dopant region with the first doping concentration, and forming a second high voltage dopant region with a second doping concentration for forming a bit line junction region on a side of the select transistor separated from the first high voltage dopant region; forming the bit line junction region by forming a doping region with a third doping concentration on the second high voltage dopant region with the second doping concentration; and forming the common source region including a dopant region with the third doping concentration being adjacent to the memory transistor and separated from the dopant region with the first doping concentration, wherein the third doping concentration is higher than the second doping concentration.

According to another exemplary embodiment of the present invention, a process of forming the memory transistor gate and the select transistor gate comprises: forming a first conductive layer and an inter-gate insulating film on the first insulating film; forming a floating gate of the memory transistor gate by etching the first conductive layer and the inter-gate insulating film selectively; forming a second conductive layer on the first insulating film and on the inter-gate insulating film; and forming a sense line on the floating gate of the memory transistor gate and forming a word line on the floating gate of the select transistor gate by etching the second conductive layer selectively.

According to yet another exemplary embodiment of the present invention, a process of forming the memory transistor gate and the select transistor gate comprises: forming a first conductive layer and an inter-gate insulating film on the first insulating film; forming a floating gate of the memory transistor gate and a floating gate of the select transistor gate by etching the first conductive layer and the inter-gate insulating film selectively; forming a second conductive layer on the first insulating film and on the inter-gate insulating film; and forming a word line on the floating gate of the select transistor gate and a sense line on the floating gate of the memory transistor gate by etching the second conductive layer selectively.

According to another exemplary embodiment of the present invention, a process of forming the memory transistor gate and the select transistor gate comprises: forming a first conductive layer on the first insulating film; defining a width of the first conductive layer in a direction to the sense line by etching the first conductive layer selectively; forming an inter-gate insulating film and a second conductive layer on the first conductive layer being selectively etched; forming a floating gate, an inter-gate insulating film, and a sense line of the memory transistor gate with a self-aligned stacked structure, and forming a floating gate, an inter-gate insulating film, and a word line of the select transistor gate with a self-aligned stacked structure.

These and other exemplary embodiments will become more apparent by describing in detail exemplary embodiments thereof with reference to the attached drawings.

DETAILED DESCRIPTION OF THE EXEMPLARY EMBODIMENTS

Exemplary embodiments of the present invention will now be described more fully with reference to the accompanying drawings. This disclosure may, however, be embodied in many different forms and should not be construed as being limited to the embodiments set forth herein. Rather, these embodiments are provided so that this disclosure will be thorough and complete, and will fully convey the concept of the invention to those skilled in the art.

Figure 1A:
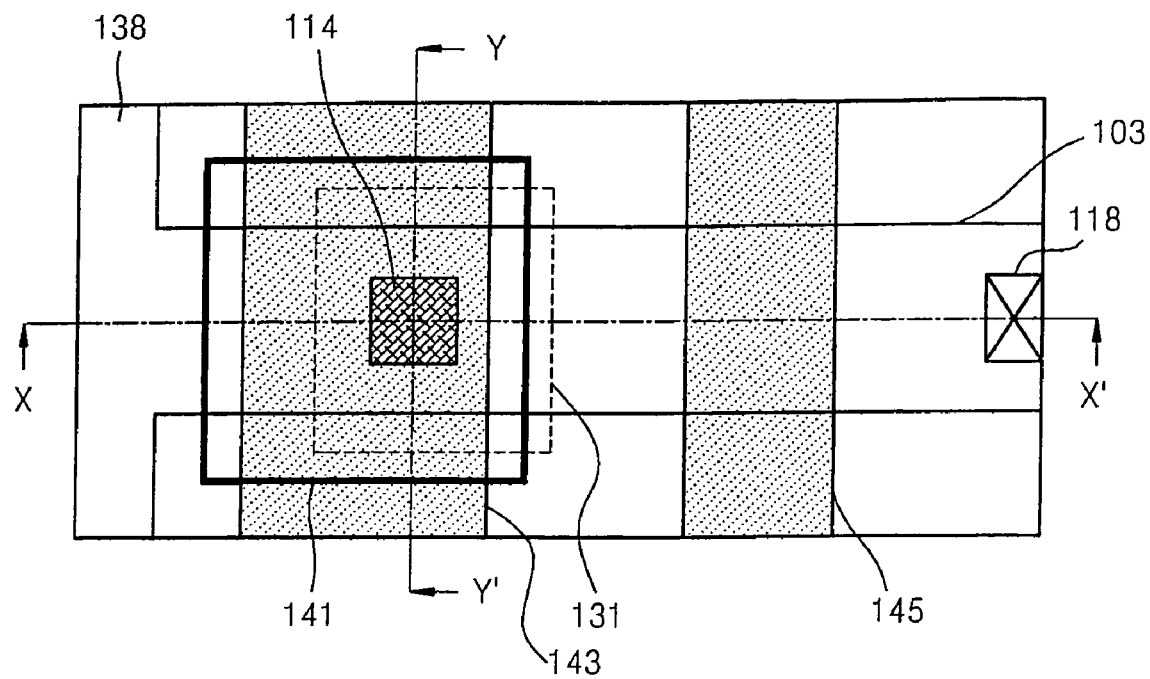
FIG. 1A is a layout of a conventional EEPROM cell.
Figure 1B:
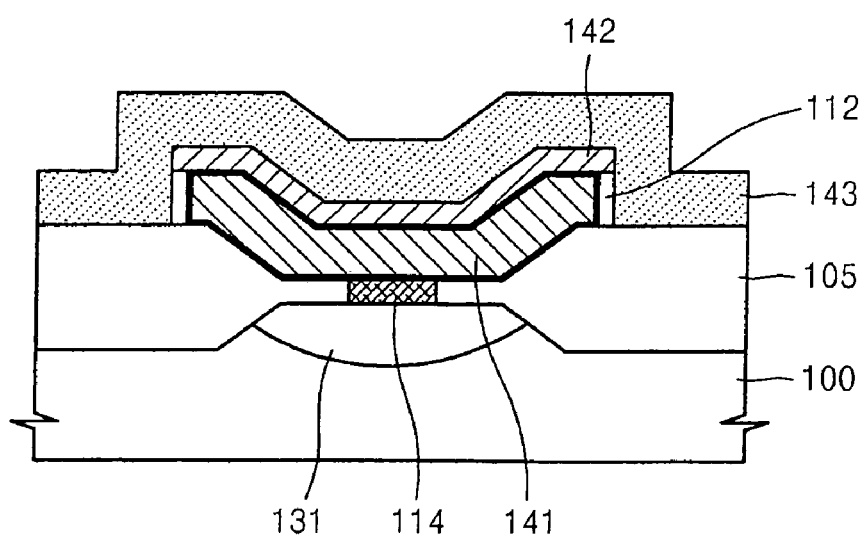
FIGS. 1B and 1C are cross-sectional views of an EEPROM cell taken along the lines Y-Y' and X-X' in FIG. 1A, respectively.
Figure 1C:
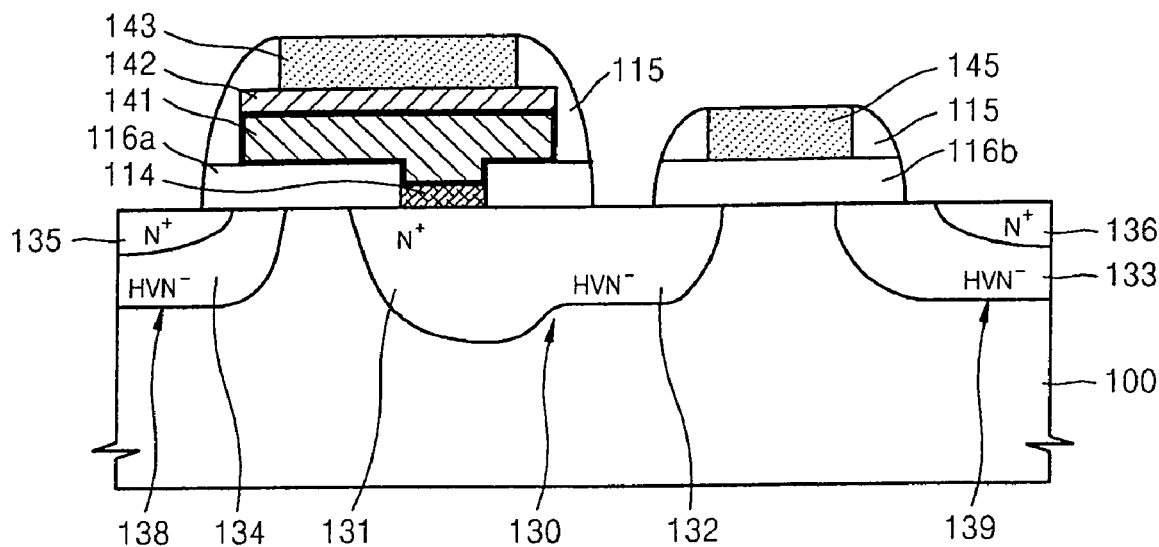
Figure 1D:
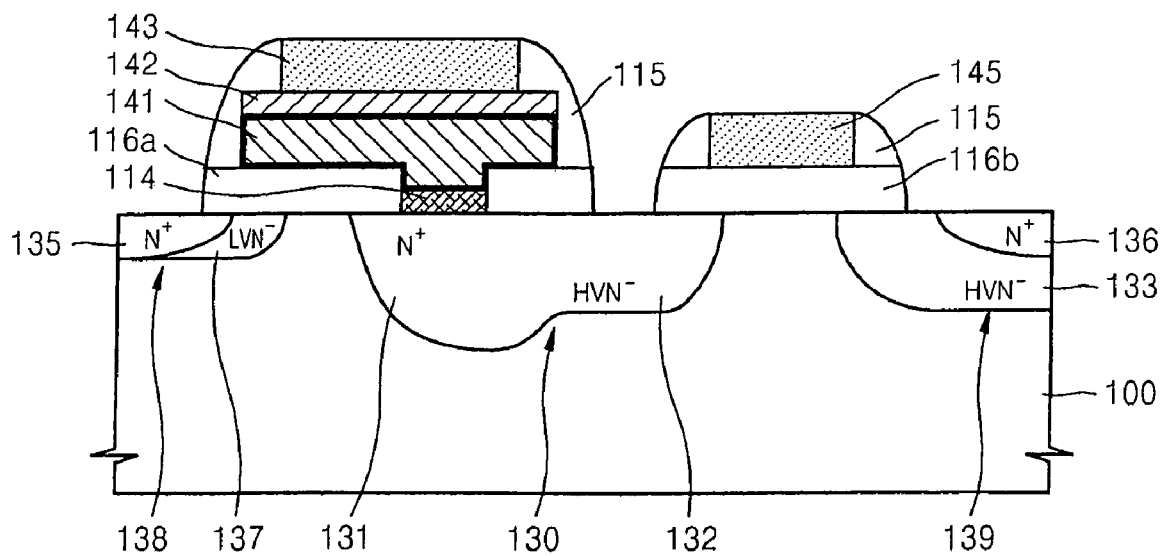
FIG. 1D is a cross-sectional view of another conventional EEPROM cell.
Figure 2:
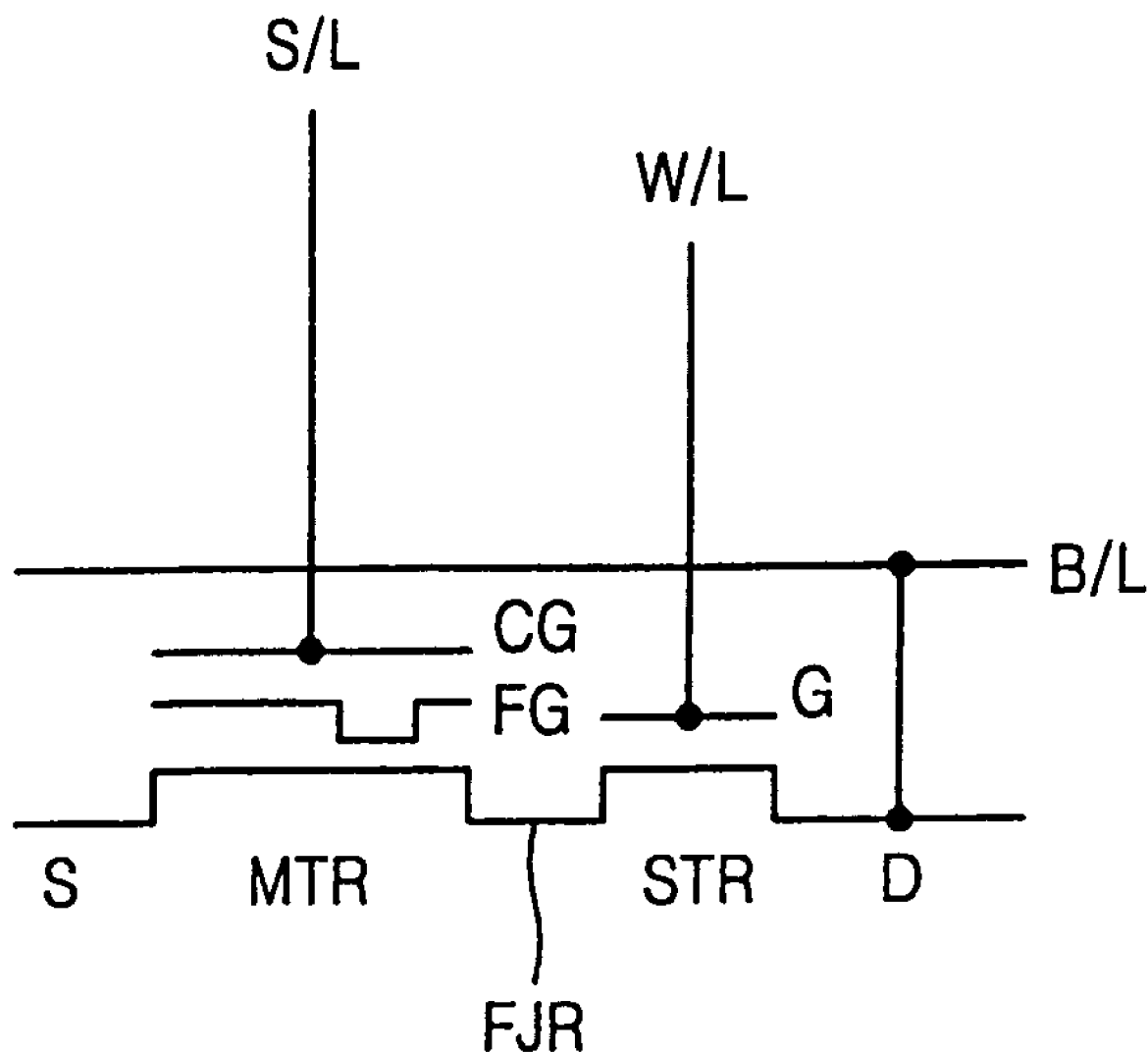
FIG. 2 is an equivalent circuit diagram of an EEPROM cell according to an exemplary embodiment of the present invention.

FIG. 2 is an equivalent circuit diagram of an EEPROM cell according to an exemplary embodiment of the present invention. Referring to FIG. 2, the EEPROM cell includes a memory transistor MTR and a select transistor STR. The memory transistor MTR stores data at a "1" or a "0" level and the select transistor STR performs selecting memory bits. The memory transistor MTR includes a common source region S, a floating junction region FJR, a bit line junction region D, and a gate G. A word line W/L is connected to the gate of the select transistor STR, and a bit line B/L is connected to the bit line junction region D. A sense line S/L is connected to a control gate CG of the memory transistor MTR. The select transistor STR is connected to the memory transistor MTR by the floating junction region FJR.

The process of erasing, programming, and data reading of a FLOTOX EEPROM cell according to an exemplary embodiment of the present invention is performed as follows.

Data can be erased from the FLOTOX EEPROM cell by applying a high voltage of about 15V~about 20V to the sense line S/L and the word line W/L, by applying 0V to the bit line B/L, and by applying 0V to a common source or floating the common source. Applying the above voltages or floating the common source results in electrons accumulating in a floating gate FG of the memory transistor MTR. The accumulated electrons in the floating gate FG increases the threshold voltage Vth of the memory transistor MTR to about 3V~about 7 V.

Data can be programmed to the cell by applying 0V to the sense line S/L, by applying about 15V~about 20V to the word line W/L and the bit line B/L, and floating the common source. Applying the above voltages or floating the common source results in discharging of electrons accumulated in the floating gate FG of the memory transistor MTR. Discharging of electrons accumulated in the floating gate FG reduces the threshold voltage Vth of the memory transistor MTR from about −4V to about 0V.

Data in the cell can be read by determining whether there is any current flow in the memory transistor MTR while applying about 0V to the source region S, applying about 1.7V to the sense line S/L, applying about 3.3V to the word line W/L, and applying about 2.5 V to the bit line B/L.

Figure 3A:
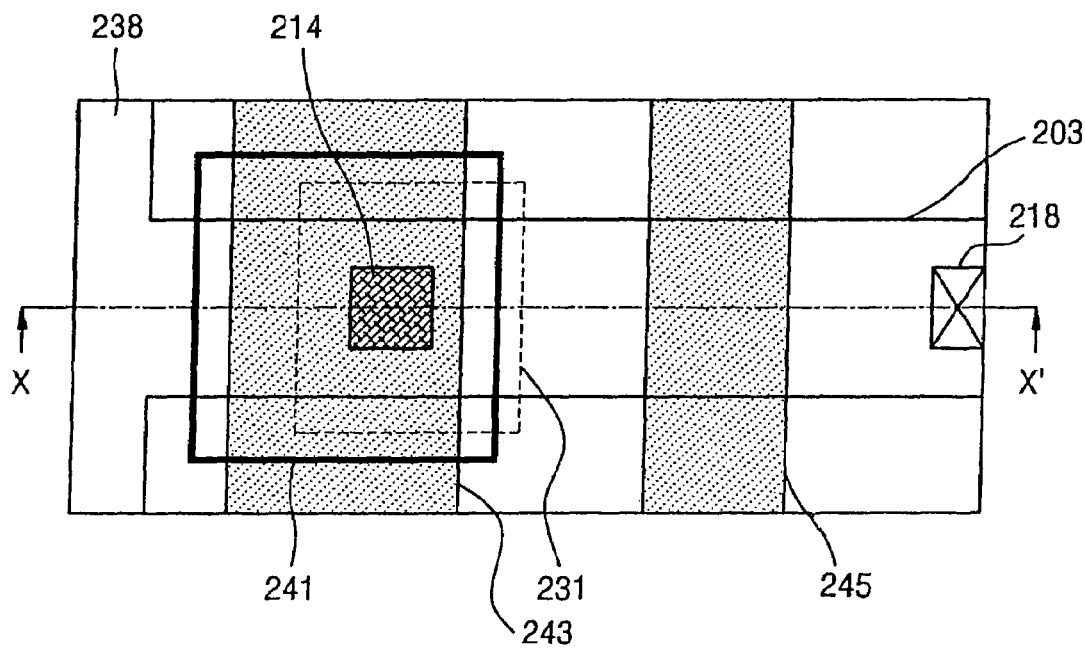
FIG. 3A is a layout of an EEPROM cell according to an exemplary embodiment of the present invention.
Figure 3B:
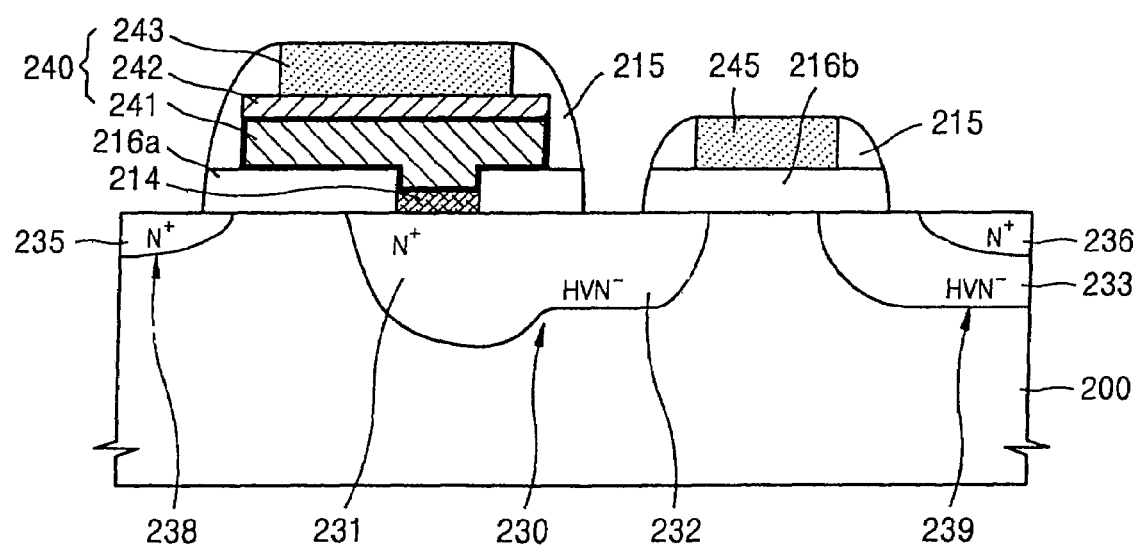
FIG. 3B is a cross-sectional view of the EEPROM cell taken along a line X-X' in FIG. 3A.

FIG. 3A is a layout of the EEPROM cell of FIG. 2. FIG. 3B is a cross-sectional view of the EEPROM cell taken along the line X-X' in FIG. 3A.

Referring to FIGS. 3A and 3B, a semiconductor substrate 200 includes an active region 203 and a field region excluding the active region 203. A gate insulating film 216a of the memory transistor MTR which includes a thin tunnel insulating film 214, and a gate insulating film 216b of the select transistor STR are formed on the active region 203 of the substrate 200. The tunnel insulating film 214 can be formed of $SiO_2$ or SiON.

A memory transistor gate 240 includes a floating gate 241, an inter-gate insulating film 242, and a control gate 243 stacked on the gate insulating film 216a. The control gate 243 forms a sense line extending along a line. Also, a select transistor gate 245 formed as a single gate is formed on the gate insulating film 216b. The select transistor 245 forms a word line extending along a line. The floating gate 241 can be formed of a polysilicon film, and the sense line and word line can be formed of a polysilicon film or a polycide film such as $WSi_x$. The inter-gate insulating film 242 can be formed of $SiO_2$ or an oxide-nitride-oxide (ONO).

Three junction regions (i.e., a floating junction region 230, a common source region 238, and a bit line junction region 239) are formed on the semiconductor substrate 200. The conductive type of the semiconductor substrate is different in that, for example, the semiconductor substrate 200 is p-type conductivity and the three junction regions are n-type conductivity.

The floating junction region 230 extends from below the tunnel insulating film 214 to a lateral of the select transistor gate 245 on the semiconductor substrate 200. The floating junction region 230 includes a deep N+ type dopant region 231 below the tunnel insulating film 214 and an N− type dopant region 232 formed adjacent to the N+ type dopant region 231.

The common source region 238 is adjacent to the floating gate 241 of the memory transistor and separated at a distance from the floating junction region 230. The common source region 238 is a source region of the memory transistor, and has an N+ type dopant region. The common source region 238 has a shallower junction depth than the N+ type dopant region 231 and the N− type dopant region 232 of the floating junction region 230. As a result, unlike a conventional DD or a conventional LDD structure of the common source region, an N− type dopant is not implanted into the common source region 238 according to an exemplary embodiment of the present invention.

The bit line junction region 239 is formed on a side of the select transistor gate 245 and separated at a distance from the floating junction region 230. The bit line junction region 239 is a drain region of the select transistor. The bit line junction region 239 has a DD structure including a deep N− type dopant region 233 and a shallow N+ type dopant region 236 formed in the N− type dopant region 233. A bit line contact (not shown) is electrically connected to the bit line junction region 239.

The EEPROM cell according to an exemplary embodiment of the present invention has side wall spacers 215 on both side walls of the memory transistor gate 240 and the select transistor gate 245.

In the EEPROM device according to an exemplary embodiment of the present invention, the N+ type dopant region 235 constituting the common source region 238 has a shallower junction depth than the N− type dopant region 232 of the floating junction region 230. The N+ type dopant region 235 has a shallower junction depth than that of the N− type dopant region 233 of the bit line junction region 239. The N− type dopnat regions 232 and 233 are HVN− dopant regions where a high voltage of from about 15V to about 20 V can be applied. The N− type dopant regions 232 and 233 are formed at a greater depth than the N+ type dopant region 235 of the common source region 238.

As a result, the amount of lateral diffusion toward the floating junction region 230 from the common source region 238 is less than the amount of lateral diffusion of the conventional common source region with the DD or LDD structure. The common source region 238 has a single junction structure formed of the N+ type dopant. Accordingly, an inconsistency of the threshold voltage Vth can be prevented since the effective channel length may increase without enlarging the cell size.

Figure 4A:
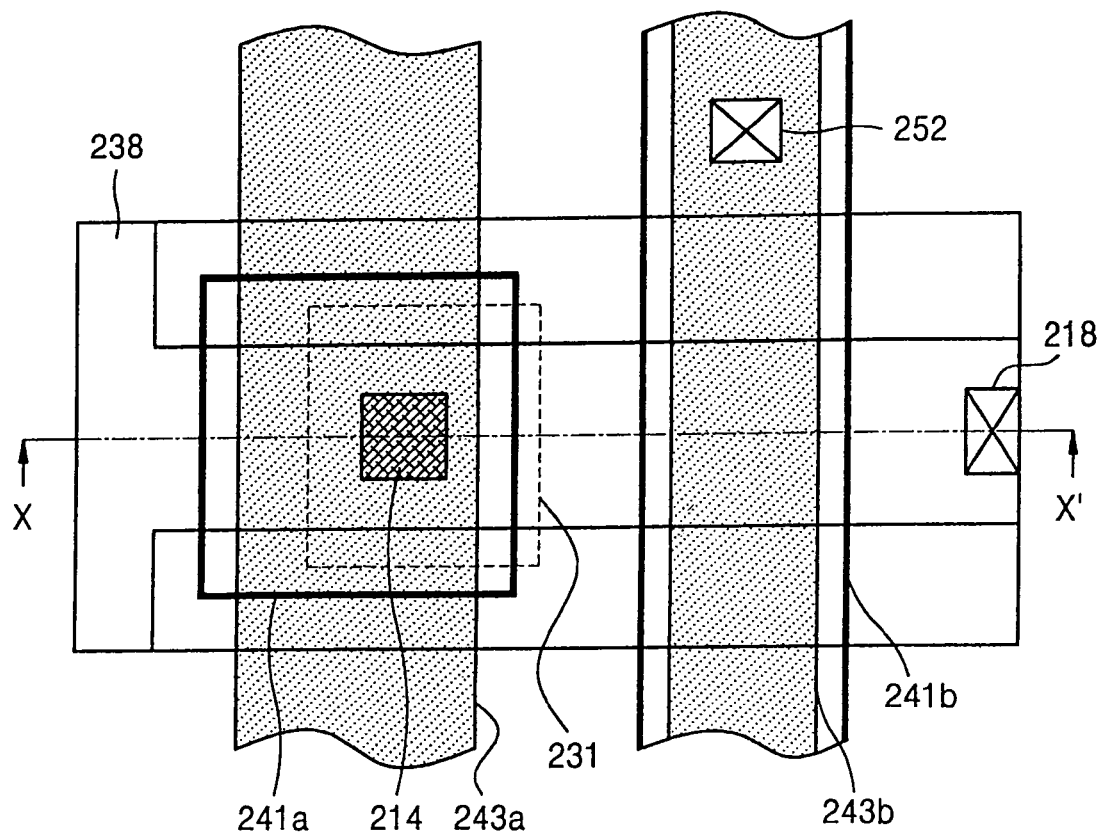
FIG. 4A is a layout of an EEPROM cell according to an exemplary embodiment of the present invention.
Figure 4B:
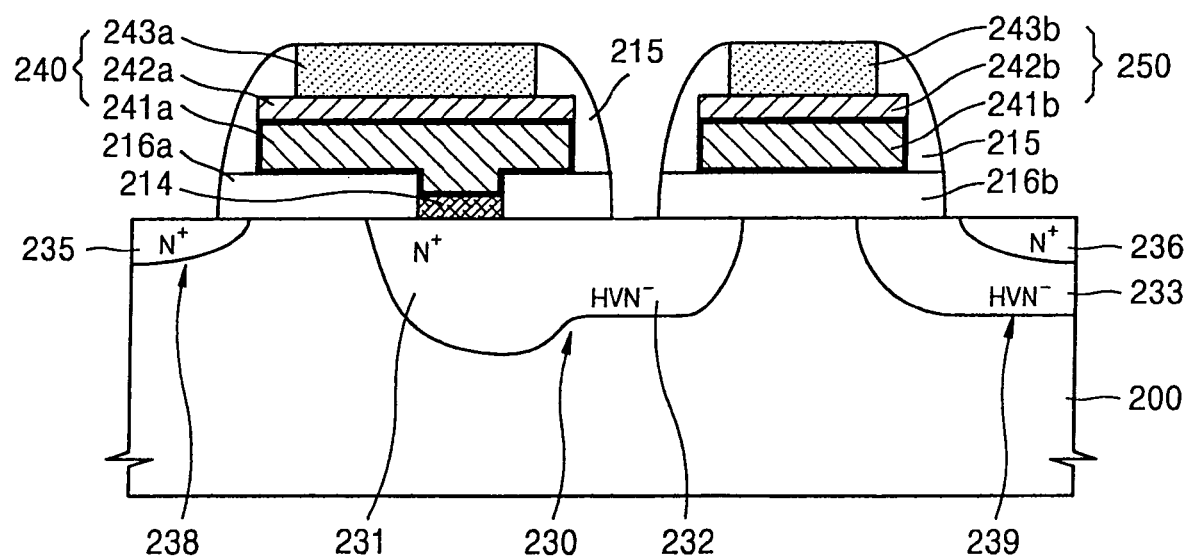
FIG. 4B is a cross-sectional view of the EEPROM cell taken along a line X-X' in FIG. 4A.

FIG. 4A is a layout of an EEPROM cell according to an exemplary embodiment of the present invention. FIG. 4B is a cross-sectional view taken along a line X-X' in FIG. 4A.

The EEPROM cell depicted in FIGS. 4A and 4B has same structure as the structure of FIGS. 3A and 3B except for a select transistor gate 250. Referring to FIG. 4B, the select transistor gate 250 includes a floating gate 241b on the gate insulating film 216b, an inter-gate insulating film 242b, and a word line 243b stacked between the floating junction region 230 and the bit line junction region 239. Descriptions of other parts of the EEPROM cell in FIGS. 4A and 4B are same as described with reference to the FIGS. 3A and 3B. The floating gate 241b and the word line 243b are electrically connected via a contact 252 in the select transistor gate 250 (refer to FIG. 4A).

Figure 5A:
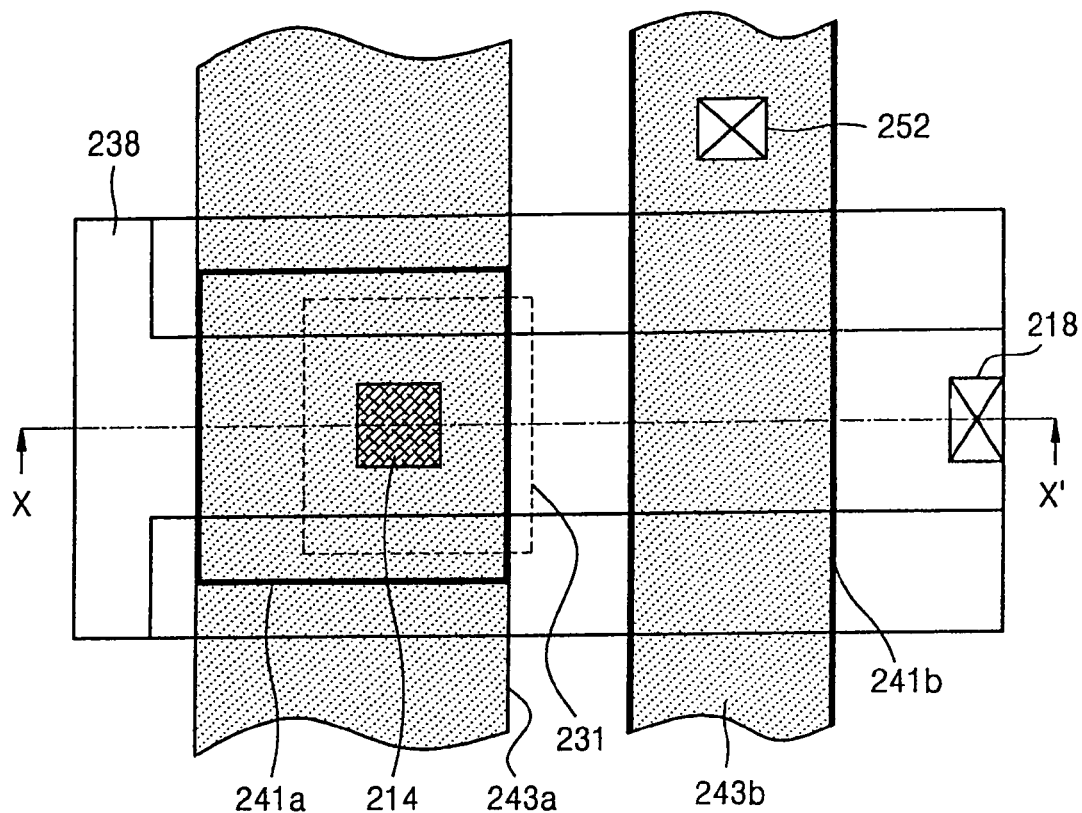
FIG. 5A is a layout of an EEPROM cell according to an exemplary embodiment of the present invention.
Figure 5B:
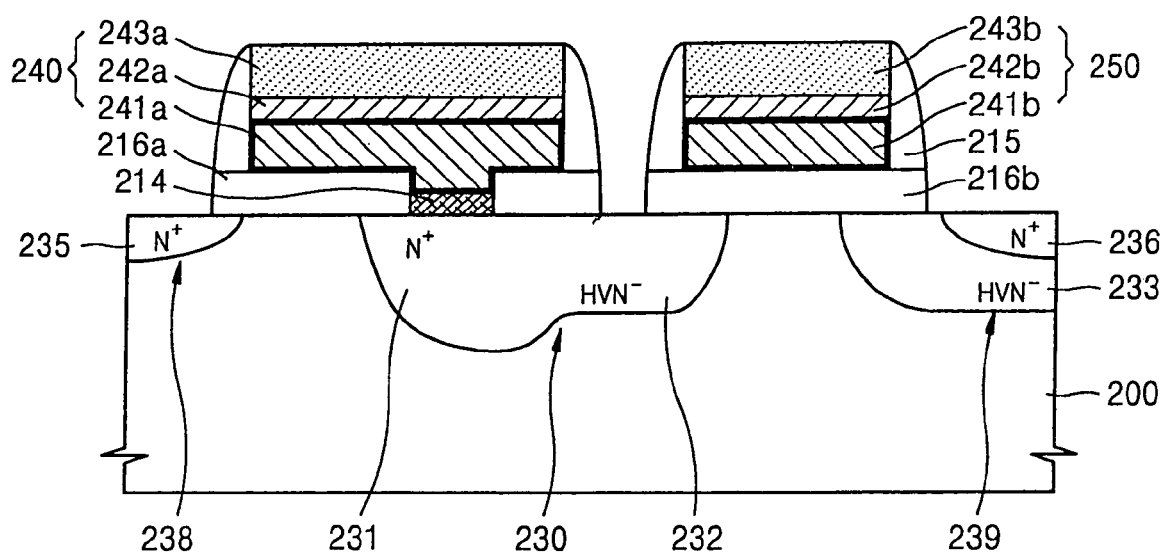
FIG. 5B is a cross-sectional view taken along a line X-X' in FIG. 5A.

FIG. 5A is a layout of an EEPROM cell according to an exemplary embodiment of the present invention. FIG. 5B is a cross-sectional view taken along a line X-X' in FIG. 5A.

The EEPROM cell depicted in FIGS. 5A and 5B are substantially same as the EEPROM cell depicted in FIGS. 4A and 4B except that the memory transistor gate 240 and the select transistor gate 250 are in a self-aligned stacked structure. In other words, as depicted in FIG. 5B, the floating gate 241a, the inter-gate insulating film 242a, and the sense line 243a of the memory transistor gate 240 are patterned with equal widths. The floating gate 241b, the inter-gate insulating film 242b, and the sense line 243b of the select transistor gate 250 are patterned with equal widths. Further, each of the layers 241a, 242a, and 243a of the memory transistor gate 240 are formed at the same time as each of the corresponding layers 241b, 242b, and 243b of the select transistor gate 250 are formed.

FIGS. 6 to 13 are cross-sectional views illustrating a method of fabricating an EEPROM cell of FIG. 4B.

Figure 6:
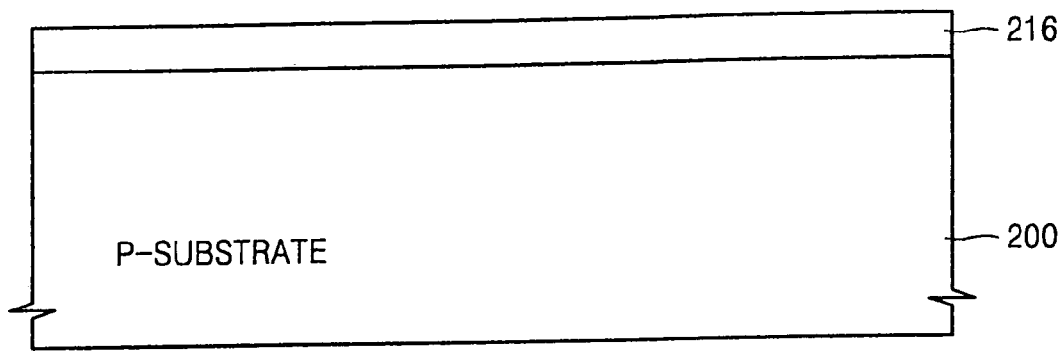
FIGS. 6 to 13 are cross-sectional views i showing a method of fabricating the EEPROM cell of FIG. 4B.

Referring to FIG. 6, a first insulating film 216 is formed on a P-type semiconductor substrate 200. Preferably, the first insulating film 216 is formed of an oxide film such as a $SiO_2$ film with a thickness of about 250~about 500 Before forming the first insulating film 216, an active region (not shown) is defined by forming a device isolation field oxide layer (not shown) in a region excluding the active region.

Figure 7:
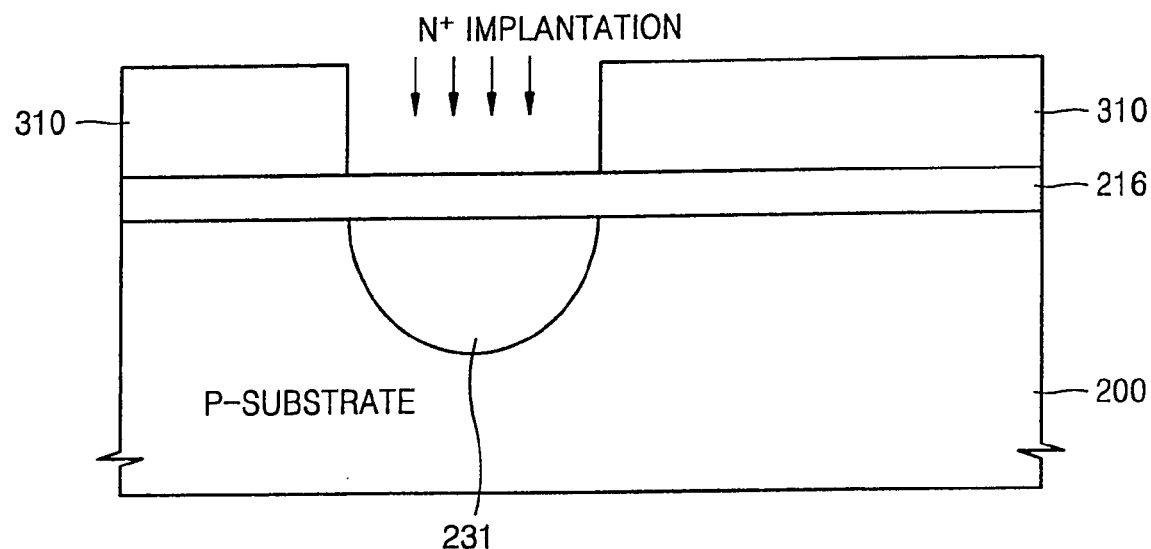

Referring to FIG. 7, a resist film 310 is deposited on the first insulating film 216 and is patterned. Then a portion of the first insulating film 216 is exposed. An N+ type dopant region 231 of a floating junction region is formed below the first insulating film 216 exposed by the resist film 310. The N+ type dopant region 231 is formed by implanting N+ ions into the semiconductor substrate 200 using the resist film 310 as an implementation mask. When forming the N+ type dopant region 231, preferably, arsenic ions can be implanted at a dose of about $1.0 \times 10^{13}$~about $9.0 \times 10^{13}$ atoms/cm$^3$ with an implanting energy of about 100 keV. Phosphorus ions can also be implanted at a dose of about $1.0 \times 10^{13}$~about $1.0 \times 10^{14}$ atoms/cm$^3$ with an implanting energy of about 40 keV~about 100 keV. The resist film 310 is removed after forming the N+ type dopant region 231.

Figure 8:
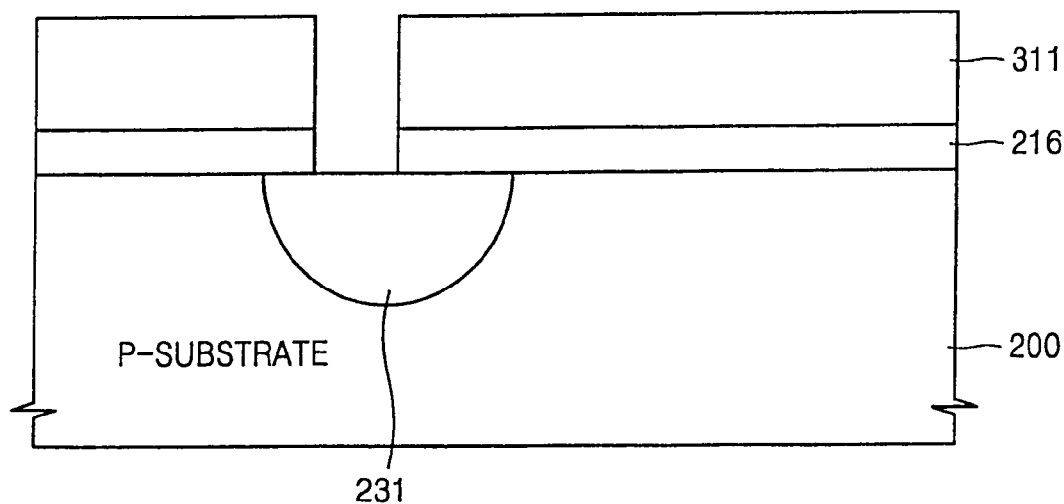

Referring to FIG. 8, a resist film 311 is formed on the first insulating film 216 and is patterned. Then, a portion of the semiconductor substrate 200 where the N+ type dopant region 231 is formed is exposed. The portion of the semiconductor substrate 200 is exposed by etching a portion of the first insulating film 216 formed on the N+ type dopant region 231. The patterned resist film 311 is used as an etch mask.

Figure 9:
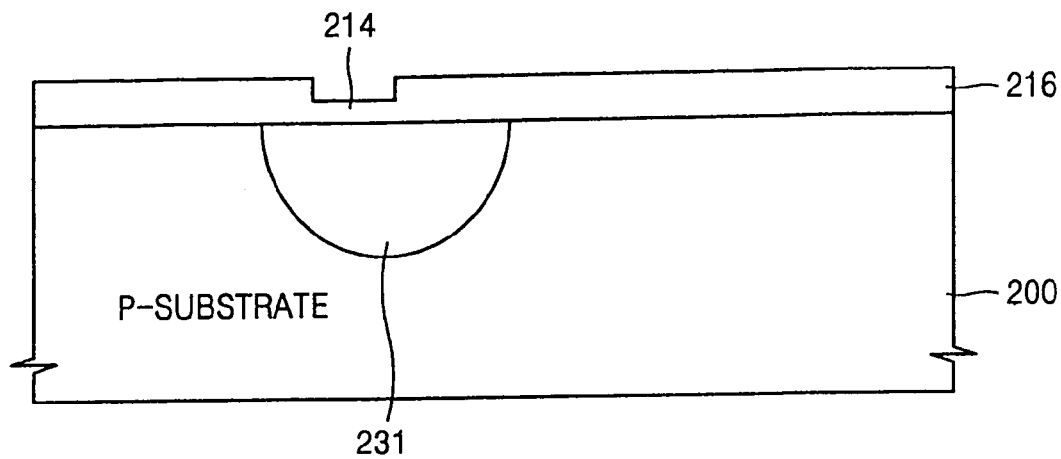

Referring to FIG. 9, a thin tunnel insulating film 214 is formed by oxidizing the exposed portion of the semiconductor substrate 200 using a thermal oxidation method. The tunnel insulating film 214 can be formed of $SiO_2$ or SiON. A thickness of the thin tunnel insulating film 214 is shallower than the thickness of the first insulating film 216. Preferably, the thickness of the tunnel insulating film 214 is about 60~about 80 The resist film 311 is removed after forming the tunnel insulating film 214.

Figure 10:
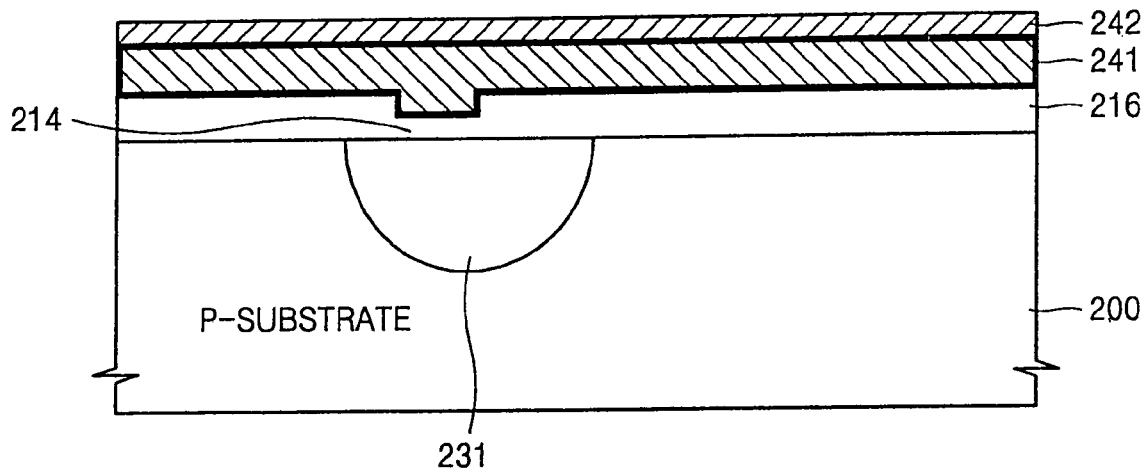

Referring to FIG. 10, a first conductive layer 241 and an inter-gate insulating film 242 are formed on the first insulating film 216 and the tunnel insulating film 214. Preferably, the first conductive layer 241 is formed of a polysilicon film, and the inter-gate insulating film 242 is formed of $SiO_2$ or SiON.

Figure 11:
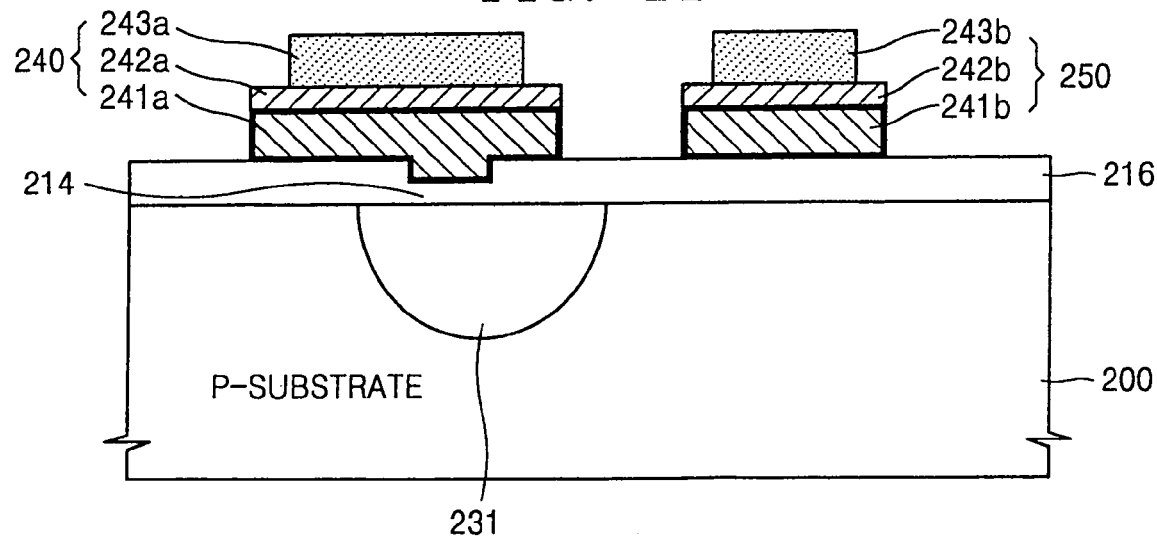

Referring to FIG. 11, a floating gate 241a and an inter-gate insulating film 242a of a memory transistor, and a floating gate 241b and an inter-gate insulating film 242b of a select transistor are formed by selectively etching the first conductive layer 241 and the inter-gate insulating film 242. A second conductive layer is formed on the inter-gate insulating films 242a and 242b. Then a sense line 243a and a word line 243b are formed by selectively etching the second conductive layer. Preferably, the inter-gate insulating films 242a and 242b are formed of polysilicon film or a polycide film such as a $WSi_x$. The memory transistor gate 240 includes the floating gate 241a, the inter-gate insulating film 242a, and the sense line 243a. The select transistor gate 250 includes the floating gate 241b, the inter-gate insulating film 242b, and the word line 243b.

Figure 12:
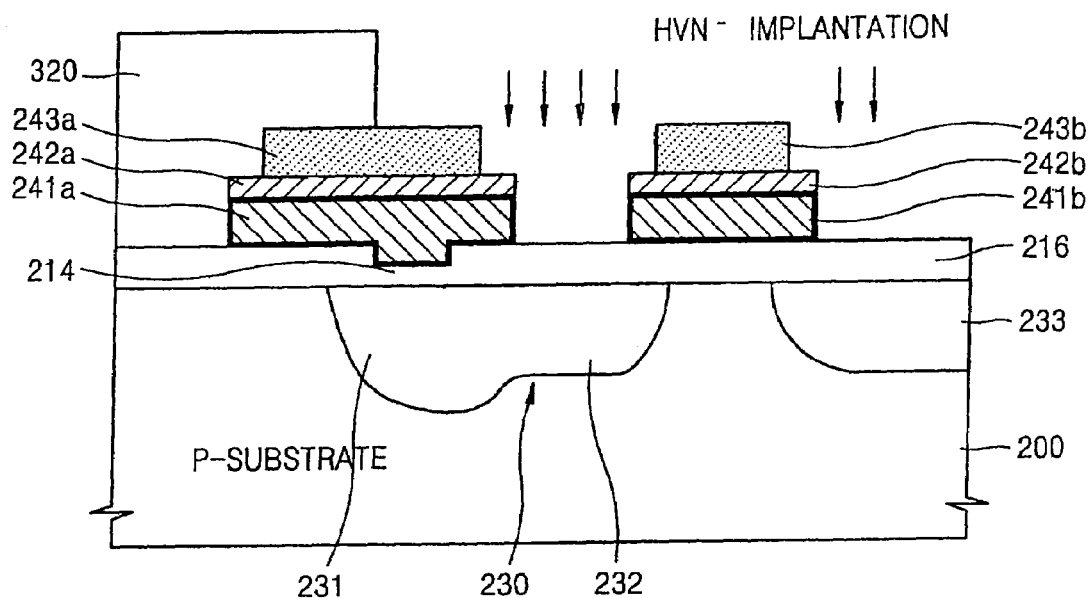

Referring to FIG. 12, a portion of the first insulating film 216 is exposed by depositing a resist film 320 on the memory transistor gate 240, the select transistor gate 250 and the first insulating film 216. Then the resist film 320 is patterned. HVN– dopant regions 232 and 233 are formed by implanting HVN– ions using the resist film 320 as an implantation mask. The floating junction region 230 is formed by connecting the HVN– dopant region 232 and the N+ type dopant region 231. The HVN– dopant region 233 forms an N– type dopant region of the bit line junction region 239.

According to an exemplary embodiment of the present invention, the HVN– type dopant regions 232 and 233 can be formed by implanting phosphorus ions at a dose of about $5.0 \times 10^{12}$~about $9.0 \times 10^{12}$ atoms/cm$^3$ with an implanting energy of about 90 keV. The HVN– dopant regions 232 and 233, which are high voltage and low concentration dopant regions, are formed deeper than the N+ type dopant regions in the common source region 238 and a bit line junction region 239 (shown in FIG. 13). The resist film 320 is removed after forming the HVN– type dopant regions 232 and 233.

Figure 13:
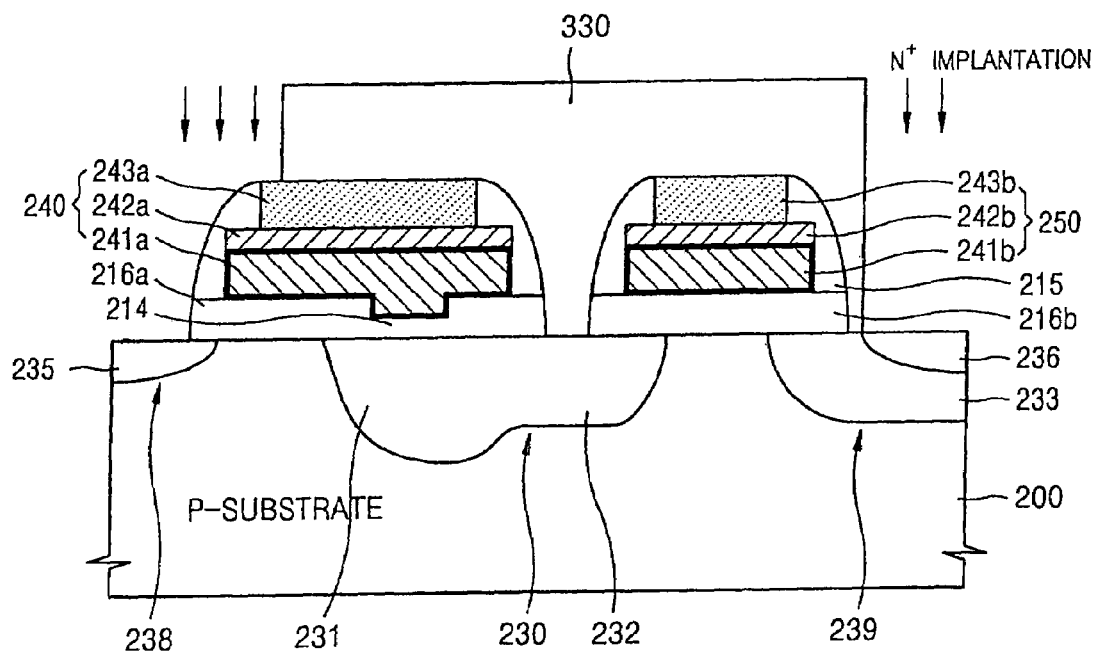

Referring to FIG. 13, an insulating film is deposited to form a spacer on the entire surface of above structure. By using, for example, an anisotropic dry etching, side wall spacers 215 are formed on both side walls of the memory transistor gate 240 and the select transistor gate 250. Then, by depositing a resist film 330 and patterning the resist film 330, portions of the substrate 200 are exposed where an N+ type dopant region 235 for a common source region 238 and an N+ type dopant region 236 for a bit line junction region 239 are to be formed. The N+ type dopant region 235 in the common source region 238 and the N+ type dopant region 236 in the bit line junction region 239 are formed by implanting N+ ions using the resist film 330 as an implantation mask. A thick insulating film (not shown) and a contact hole (not shown) are formed on above structure such that the N+ type dopant region 236 is exposed. A bit line contact (not shown) is formed by filling the contact hole with a conductive material.

According to an exemplary embodiment of the present invention, when forming the N+ type dopant regions 235 and 236, arsenic ions are implanted at a dose of about $1.0 \times 10^{15}$~about $5.0 \times 10^{15}$ atoms/cm$^3$ with an implanting energy of about 50 keV.

According to an exemplary embodiment of the present invention, the common source region 238 has a single junction structure including the N+ type dopant region 235. The bit line junction region 239 has a shallow DD structure including the N+ type doapnt region 236 in the HVN– dopant region 233. The N+ type dopant region 235 in the common source region 238 and the N+ type dopant region 236 in the bit line junction region 239 are formed under same implantation conditions. The depth of the N+ type dopant regions 235 and 236 is shallower than the depth of the HVN– dopant regions 231 and 233.

In the common source region 238 including the N+ type dopant region 235, the lateral diffusion toward the floating junction region 230 is reduced compared to a common source region having the conventional DD structure or the LDD structure. As a result, an inconsistent threshold voltage can be prevented by increasing the effective channel length of the transistor without increasing the cell size. Further, when operating the EEPROM device, the common source region 238 is grounded or floated. In other words, no high voltage is applied to the common source region 238. Therefore, the common source region 238 can be operated under a favorable EEPROM working characteristic without an additional LDD structure or DD structure.

A method of fabricating the EEPROM cell having a cross-sectional view depicted in FIG. 3B is same as the method of fabricating the EEPROM cell explained above except that a floating gate is not included in the select transistor gate 250. In other words, to fabricate the EEPROM cell depicted in FIG. 3B, the floating gate 241a is formed only in the memory transistor gate 240 by etching the first conductive layer 241. As a result of the etching, the first conductive layer 241 remains only in a portion of the first insulating film including the tunnel insulating film 214. The first conductive layer 241 is not formed in the select transistor gate 245.

FIGS. 14 through 17 are cross-sectional views illustrating a method of fabricating the EEPROM cell of FIG. 5B.

Figure 14:
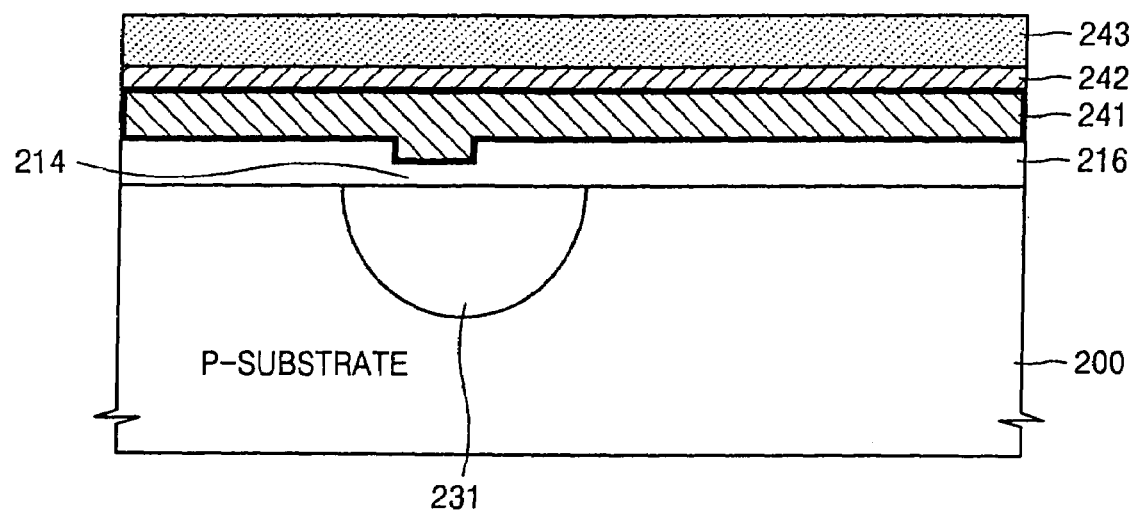
FIGS. 14 to 17 are cross-sectional views for showing a method of fabricating the EEPROM cell of FIG. 5B.

Referring to FIG. 14, a first insulating film 216, a first conductive layer 241, a inter-gate insulating film 242 and a tunnel insulating film 214 are formed on a substrate 200 using processes depicted in FIGS. 6 to 10. A second conductive layer 243 is formed on the inter-gate insulating layer 242. Although not shown in drawings, before forming the inter-gate insulating film 242, the first conductive layer 241 is selectively etched to define a width of the first conductive layer 241 in a direction to the sense line 243a shown in FIG. 15. The width of the selectively etched first conductive layer can also be described as the width of the floating gate 241a perpendicular to the line X-X' in FIG. 5A.

Figure 15:
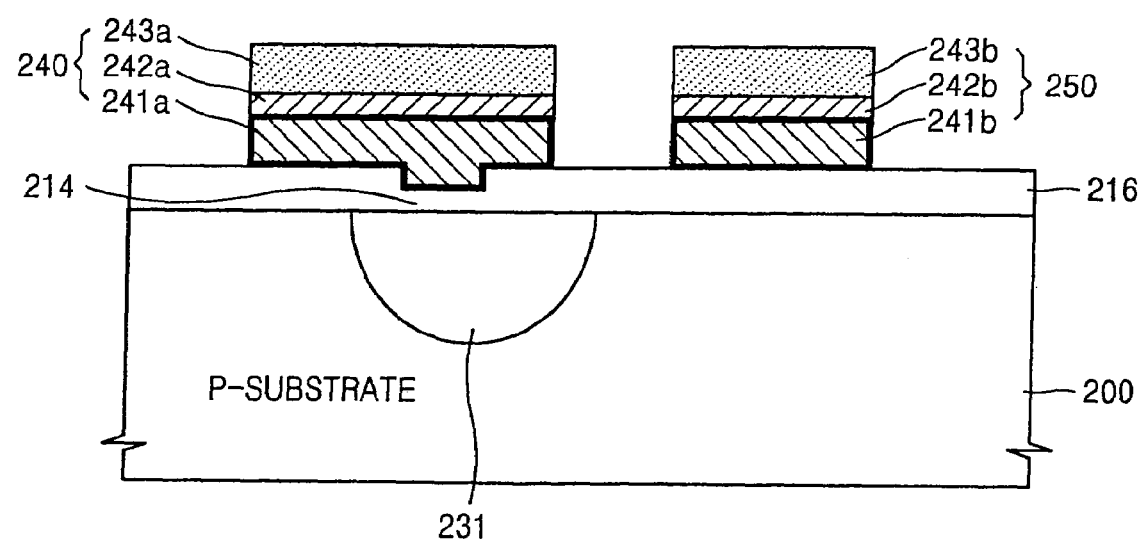

Referring to FIG. 15, a memory cell transistor 240 includes a floating gate 241a, an inter-gate insulating film 242a and a sense line 243a A select transistor 250 includes a floating gate 241b, an inter-gate insulating film 242b and a sense line 243b. The memory cell transistor 240 and the select transistor 250 are formed by selectively etching the first conductive layer 241, the inter-gate insulating film 242, and the second conductive layer 243. Preferably, the second conductive layer 243 is formed of a polysilicon film or a polycide film such as $WSi_x$. The memory transistor gate 240 having a self-aligned stacked structure includes the floating gate 241a, the inter-gate insulating film 242a, and the sense line 243a formed in a stack with a same width. A select transistor gate 250 having a self-aligned stack structure includes the floating gate 241b, inter-gate insulating film 242b, and the sense line 243b formed in a stack with a same width.

Figure 16:
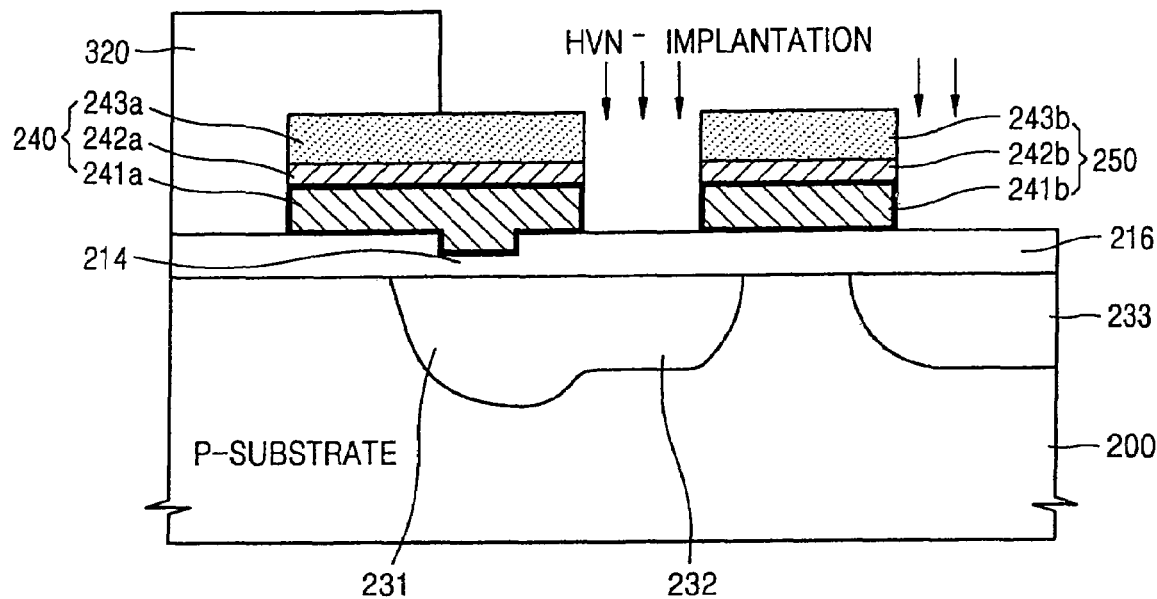

Referring to FIG. 16, a resist film 320 is deposited on the first insulating film 216, the memory transistor gate 240, and the select transistor gate 250. By patterning the resist film 320, a portion of the first insulating film 216 below which a floating junction region and a bit line junction region is to be formed is exposed. Next, HVN– dopant regions 232 and 233 are formed by implanting HVN– ions using the resist film 320 as an implantation mask. The HVN– dopant region 232 is formed adjacent to the N+ type dopant region 231 to form the floating junction region. The HVN– dopant region 233 forms an N– type dopant region of the bit line junction region.

According to an embodiment of the present invention, when forming the HVN– type dopant regions 232 and 233, phosphorus ions are implanted at a dose of about $1.0 \times 10^{12}$~about $5.0 \times 10^{12}$ atoms/cm$^3$ with an implanting energy of about 80~about 90 keV. The HVN– dopant regions 232 and 233 are high voltage and low concentration dopant regions. The HVN– dopant regions 232 and 233 are formed deeper than N+ type dopant regions 235 and 236 in the common source region and the bit line junction region (shown in FIG. 17), respectively. The resist film 320 is removed after forming the HVN– type dopant regions 232 and 233.

Figure 17:
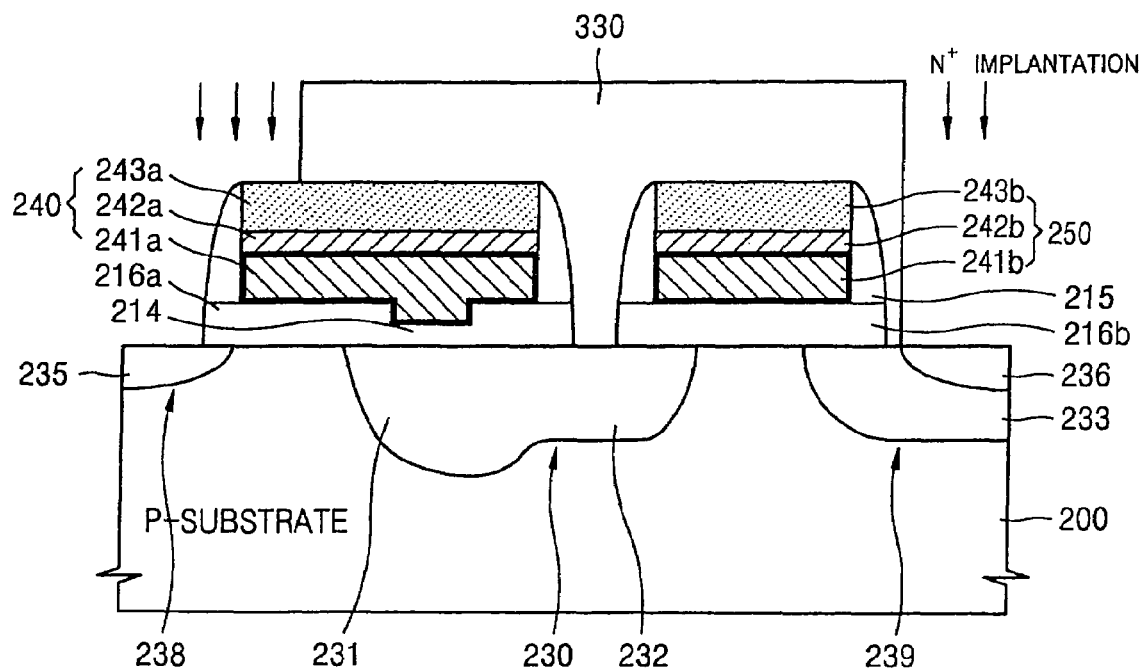

Referring to FIG. 17, an insulating film is deposited to form a spacer on the entire surface of above structure. By using, for example, anisotropic dry etching, side wall spacers 215 are formed on both side walls of the memory transistor gate 240 and the select transistor gate 250. Then, by depositing and patterning the resist film 330, portions of the substrate 200 are exposed where the N+ type dopant region 235 for the common source region 238 and the N+ type dopant region 236 for the bit line junction region 239 are to be formed. The N+ type dopant region 235 in the common source region 238 and the N+ type dopant region 236 in the bit line junction region 239 are formed by implanting N+ ions using the resist film 330 as an implantation mask. A thick insulating film (not shown) and a contact hole (not shown) are formed on above structure such that the N+ type dopant region 236 is exposed. A bit line contact (not shown) is formed by filling the contact hole with a conductive material.

According to an embodiment of the present invention, when forming the N+ type dopant regions 235 and 236, arsenic ions are implanted at a dose of about $1.0 \times 10^{15}$~about $5.0 \times 10^{15}$ atoms/cm$^3$ with an implanting energy of about 40~about 60 keV.

According to an embodiment of the present invention, the common source region 238 has a single junction structure including the N+ type dopant region 235. The bit line junction region 239 has a shallow DD structure including the N+ type doapnt region 236 in the HVN– dopant region 233. The N+ type dopant region 235 in the common source region 238 and the N+ type dopant region 236 in the bit line region 239 are formed under same implantation conditions. The depth of the N+ type dopant regions 235 and 236 is shallower than the depth of the HVN– dopant regions 232 and 233.

In an exemplary embodiment of the present invention, the N+ type dopant region 235 in the common source region 238 and the N+ type dopant region 236 in the bit line junction region 239 are formed at the same time. Alternatively, the N+ type dopant region 235 in the common source region 238 can be formed first. Then, the N+ type dopant region 236 in the bit line junction region 239 can be formed by implanting ions through a contact hole after forming the contact hole (not shown) exposing the HVN– dopant region in the bit line junction region 239. Forming the N+ type dopant region 236 after forming a contact hole can prevent misalignment between the bit line junction region 239 and the bit line contact.

In the EEPROM device and the method of fabricating the EEPROM device according to exemplary embodiments of the present invention, since the common source region 238 has a shallower junction depth than the HVN– dopant regions 232 and 233, lateral diffusion toward the floating junction region 230 reduces. As a result, an inconsistent threshold voltage distribution can be improved because the effective channel length can be increased without increasing the cell size. Further, the size of the EEPROM device can be reduced.

Although exemplary embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method of fabricating an EEPROM device, comprising:
    forming a first insulating film on a semiconductor substrate on which an active region and an inactive region are defined;
    forming a dopant region with a first doping concentration on the semiconductor substrate on which a floating junction region is to be formed;
    forming a thin tunnel insulating film on the dopant region with the first doping concentration;
    forming a select transistor gate and a memory transistor gate on the first insulating film, the select transistor gate separated from the memory transistor gate;
    forming a floating junction region by forming a first high voltage dopant region with a second doping concentration, the second doping concentration being lower concentration than the first doping concentration and being adjacent to the dopant region with the first doping concentration, and forming a second high voltage dopant region with a second doping concentration for forming a bit line junction region on a side of the select transistor separated from the first high voltage dopant region;
    forming the bit line junction region by forming a doping region with a third doping concentration on the second high voltage dopant region with the second doping concentration; and
    forming a common source region including a dopant region having only the third doping concentration, without the second doping concentration, and being adjacent to the memory transistor and separated from the dopant region with the first doping concentration, wherein the third doping concentration is higher than the second doping concentration.

2. The method of claim 1, wherein forming the memory transistor gate and the select transistor gate comprises:
    forming a first conductive layer and an inter-gate insulating film on the first insulating film;
    forming a floating gate of the memory transistor gate by etching the first conductive layer and the inter-gate insulating film selectively;
    forming a second conductive layer on the first insulating film and on the inter-gate insulating film; and
    forming a sense line on the floating gate of the memory transistor gate and forming a word line on a floating gate of the select transistor gate by etching the second conductive layer selectively.

3. The method of claim 1, wherein forming the memory transistor gate and the select transistor gate comprises:
    forming a first conductive layer and an inter-gate insulating film on the first insulating film;
    forming a floating gate of the memory transistor gate and a floating gate of the select transistor gate by etching the first conductive layer and the inter-gate insulating film selectively;
    forming a second conductive layer on the first insulating film and on the inter-gate insulating film; and
    forming a word line on the floating gate of the select transistor gate and a sense line on the floating gate of the memory transistor gate by etching the second conductive layer selectively.

4. The method of claim 1, wherein forming the memory transistor gate and the select transistor gate comprise:
    forming a first conductive layer on the first insulating film;
    defining a width of the first conductive layer in a direction to the sense line by etching the first conductive layer selectively;
    forming an inter-gate insulating film and a second conductive layer on the first conductive layer being selectively etched;
    forming a floating gate, an inter-gate insulating film, and a sense line of the memory transistor gate with a self-aligned stacked structure, and forming a floating gate, an inter-gate insulating film, and a word line of the select transistor gate with a self-aligned stacked structure.

5. The method of claim 1, further comprising forming spacers on side walls of the memory transistor gate and the select transistor gate between the step of forming the memory transistor gate and the select transistor gate and the step of forming the common source region.

6. The method of claim 1, wherein forming the dopant region with the third doping concentration for forming the common source region and the forming dopant region with the third doping concentration for forming the bit line junction region are performed simultaneously.

7. The method of claim 1, wherein, in the step of forming the dopant region with the third doping concentration for forming the bit line junction region, after forming a contact hole and after forming the dopant region with the third doping concentration for forming the common source region, ions are implemented through the contact hole.

8. The method of claim 1, wherein the first doping concentration is about $1.0 \times 10^{15}$ atoms/cm3 to about $5.0 \times 10^{15}$ atoms/cm3, the second doping concentration is about $1.0 \times 10^{13}$ atoms/cm3 to about $9.0 \times 10^{13}$ atoms/cm3, the third doping concentration is about $5.0 \times 10^{12}$ atoms/cm3 to about $9.0 \times 10^{12}$ atoms/cm3.

* * * * *